United States Patent
Yoon et al.

(10) Patent No.: US 6,780,702 B2
(45) Date of Patent: Aug. 24, 2004

(54) METHOD OF REDUCING DEVICE PARASITIC CAPACITANCE USING UNDERNEATH CRYSTALLOGRAPHICALLY SELECTIVE WET ETCHING

(75) Inventors: Myoung Hoon Yoon, Inchon (KR); Kyoung Hoon Yang, Daejeon (KR)

(73) Assignee: Korea Advanced Institute of Science and Technology, Daejon (KR)

( * ) Notice: Subject to any disclaimer, the term of this patent is extended or adjusted under 35 U.S.C. 154(b) by 102 days.

(21) Appl. No.: 10/271,246

(22) Filed: Oct. 15, 2002

(65) Prior Publication Data

US 2003/0077870 A1 Apr. 24, 2003

(30) Foreign Application Priority Data

Oct. 24, 2001 (KR) ......................................... 2001-65567

(51) Int. Cl.[7] .......................................... H01L 21/8249
(52) U.S. Cl. ....................... 438/235; 438/236; 438/309; 438/312
(58) Field of Search ............................... 438/170, 189, 438/191, 202–208, 235–236, 309, 312, 313, 342; 257/565, 197, 200, 370

(56) References Cited

U.S. PATENT DOCUMENTS

| | | | | |
|---|---|---|---|---|
| 5,124,270 A | * | 6/1992 | Morizuka | ................... 438/319 |
| 5,298,438 A | * | 3/1994 | Hill | ............................. 438/353 |
| 5,485,025 A | * | 1/1996 | Chau et al. | .................. 257/198 |
| 5,512,496 A | * | 4/1996 | Chau et al. | .................. 438/315 |
| 5,702,958 A | * | 12/1997 | Liu et al. | ..................... 438/309 |
| 6,645,819 B2 | * | 11/2003 | Pullela | ........................ 438/319 |
| 2003/0213973 A1 | * | 11/2003 | Yoshioka et al. | ........... 257/183 |

* cited by examiner

Primary Examiner—John F. Niebling
Assistant Examiner—Jennifer M. Kennedy
(74) Attorney, Agent, or Firm—Harness, Dickey & Pierce, P.L.C.

(57) ABSTRACT

When InP DHBTs are located in parallel to a crystallographical direction of <011>, there are several advantages in the aspect of device property such as reliability. But, in case of a direction parallel to a general <011>, there exists the limitation in reducing base-collector parasitic capacitance only by collector over-etching technique due to poor lateral-etching characteristic of the InP collector.

To overcome such a problem mentioned above and improve device performance, the present invention provides a method of reducing parasitic capacitance using underneath crystallographically selective wet etching, thereby providing a self-alignable, structurally stable device.

6 Claims, 4 Drawing Sheets

METHOD OF REDUCING DEVICE PARASITIC CAPACITANCE USING UNDERNEATH CRYSTALLOGRAPHICALLY SELECTIVE WET ETCHING

BACKGROUND OF THE INVENTION

1. Field of the Invention

The present invention relates to a method of reducing device parasitic capacitance using underneath crystallographically selective wet etching. In more detail, it relates to a technology of reducing parasitic capacitance simply by using underneath crystallographically selective wet etching and thereby providing a self-alignable, structurally-stable device without resistance increase.

2. Description of the Related Art

With a recent innovative development in wireless communication technology, demand for an ultrafast broadband communication network using a millimeter wave is being increased. A local multi-point distribution system (LMDS), which transmits voices, video signals, and/or digital signals simultaneously with 1.3 GHz bandwidth within a 2~7 Km radius range using 28 GHz "Ka-band", can be a good example of this kind of network system.

For constructing an ultrafast broadband communication network as described above, it is important to develop an extremely high frequency device that can be operated in extremely high frequency band.

In a heterojunction bipolar transistor (HBT), it is very important to reduce base-collector parasitic capacitance for an ultrafast operation. Therefore, various efforts have been made for reducing base-collector parasitic capacitance such as a collector ion-implantation, a selective growing of sub-collector layer, a side overetching of collector layer, and so on.

In case of ion-implantation, however, a deep ion-implantation is required for isolation effect being occurred. And for selectively growing an epi-layer, it requires various additional processing steps to increase the overall processing complexity.

And in case of using a side etching, side etching is being carried out after locating a device in parallel to a crystallographical direction of <010> or <001>, with which side etching can be performed comparatively well. Or else, i.e. in case of a direction parallel to a general <011>, an overetching is being carried out due to the bad side-etching characteristic.

SUMMARY OF THE INVENTION

The present invention is proposed to solve the problems of the prior art mentioned above. It is therefore the object of the present invention to provide a manufacturing method, comprising simple processing steps, of a device that is structurally stable, has a small parasitic capacitance without the increase of contact resistance, and can be self-aligned.

To achieve the object mentioned above, the present invention presents a manufacturing method of a device for reducing parasitic capacitance on the laminated structure of an InP/InGaAs double heterojunction bipolar transistor (DHBT) comprising: a first process of alternately laminating a first and a second sub-collector InGaAs layers/a base InGaAs layer/an emitter InGaAs layer and an etch stop InP layer/a collector InP layer/a first and a second emitter InP layers on an InP substrate by an epitaxy method; a second process of depositing an emitter metal layer thereon and thereafter etching the emitter InGaAs layer and the first and second emitter InP layers in sequence, for a base metal to be self-alignable, to expose the upper surface of the base InGaAs layer; a third process of defining a photo resistor (PR) thereon for protecting the emitter region and thereafter etching the base InGaAs layer; a fourth process of etching the collector InP layer with using the base InGaAs layer as a mask to expose the upper surface of the second sub-collector InGaAs layer; a fifth process of selectively side-etching the second sub-collector InGaAs layer to expose the bottom surface of the collector InP layer where void region is formed; a sixth process of performing an anisotropic selective etching on the bottom surface of the collector InP layer, which contributes to parasitic capacitance, with using the second sub-collector InGaAs layer as a mask and on the surface of the etch stop InP layer simultaneously to expose the upper surface of the first sub-collector InGaAs layer; and a seventh process of eliminating the photo resistor (PR) and thereafter depositing a metal layer to form a base- and a collector-metal layers.

DETAILED DESCRIPTION OF THE EMBODIMENTS

Hereinafter, referring to appended drawings, the structure and the procedures of an embodiment of the present invention are described in detail.

FIG. 1~FIG. 7 are sectional views sequentially illustrating the manufacturing method of a heterojunction bipolar transistor (HBT) device with reducing parasitic capacitance in accordance with an embodiment of the present invention.

The present invention is now explained through the procedures of manufacturing a device on an HBT epi-layer structure where a sub-collector region, a collector region, a base region, an emitter region, and an emitter cap region are sequentially formed on a semiconductor substrate.

Figure 1:
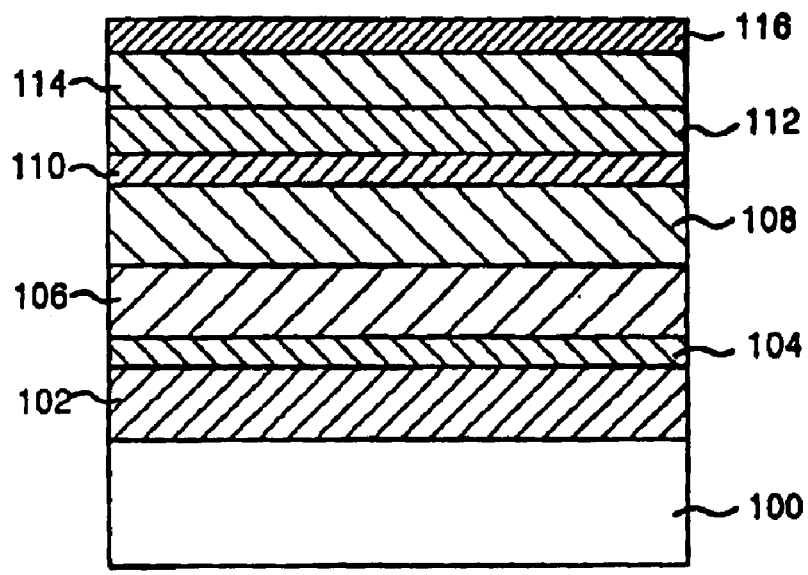
FIG. 1~FIG. 7 are sectional views sequentially illustrating the manufacturing method of a heterojunction bipolar transistor (HBT) device with reducing parasitic capacitance in accordance with an embodiment of the present invention.

FIG. 1 illustrates a laminated structure required for the present invention in which an etch stop InP layer(104) is inserted between a first sub-collector InGaAs layer(102) and a second sub-collector InGaAs layer(106) of a general InP/InGaAs double heterojunction bipolar transistor (DHBT) structure.

As shown in the figure, the laminated structure is formed by alternately laminating a first and a second sub-collector InGaAs layers(102, 106)/a base InGaAs layer(110)/an emitter InGaAs layer(116) and an etch stop InP layer(104)/a collector InP layer(108)/a first and a second emitter InP layers(112, 114) on an Fe-doped InP substrate(100) by using an epitaxy method such as a metalorganic chemical vapor deposition (MOCVD) or a molecular beam epitaxy (MBE).

Figure 2:
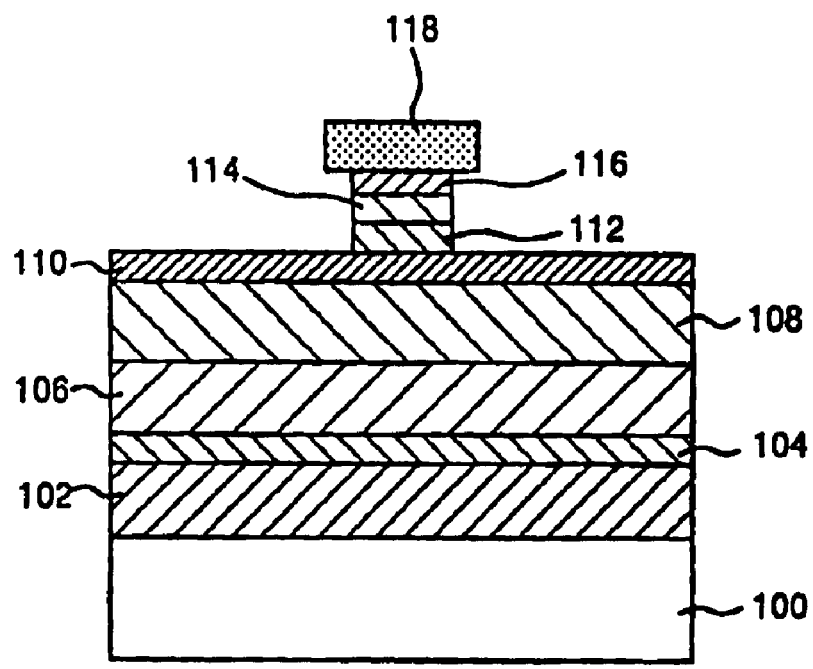

Next, as shown in FIG. 2, an emitter metal layer(118) is deposited thereon and the emitter InGaAs layer(116) and the first and second emitter InP layers(112, 114) are being etched in sequence thereafter, for a base metal to be self-alignable, to expose the base InGaAs layer(110) just like in the conventional HBT manufacturing process.

Figure 3:
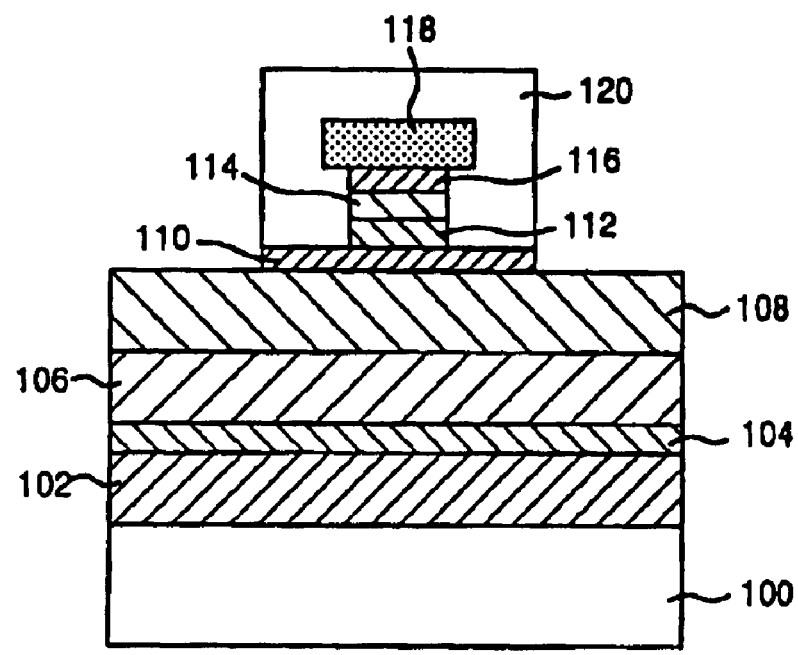

Then, as shown in FIG. 3, a photo resistor(PR; 120) is defined for protecting the emitter region and the base InGaAs layer(110) is etched thereafter with the photo resistor(120) pattern being used as an etching mask.

Here, $H_2O_2:H_3PO_4:H_2O$ is used for an etching solution, which selectively etches the base InGaAs layer(110) without making any noticeable effect on the collector InP layer(108).

Figure 4:
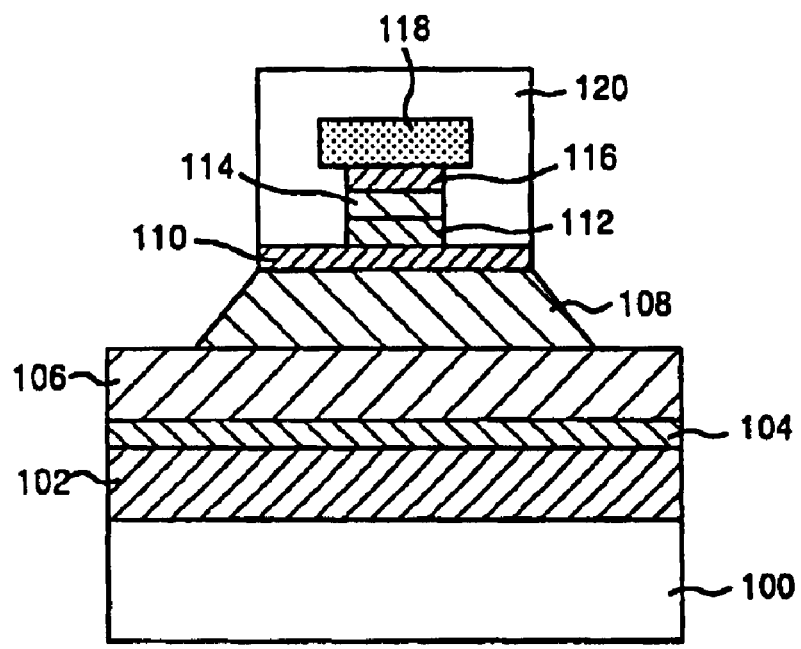

Next, the collector InP layer(108) is etched with the base InGaAs layer(110) being used as an etching mask as described in FIG. 4. At this time, etching is being started from an open end, and thus the etching profile becomes to be anisotropic. In other words, it has an anisotropic etching characteristic due to the etching speed difference along with the grating direction. The etching profile has an inclination angle ($\theta$) and the etching is stopped by the second sub-collector InGaAs layer(106).

Here, the inclination angle ($\theta$) is decided by the kind of an etching solution, its concentration and temperature, and so forth.

Figure 5:
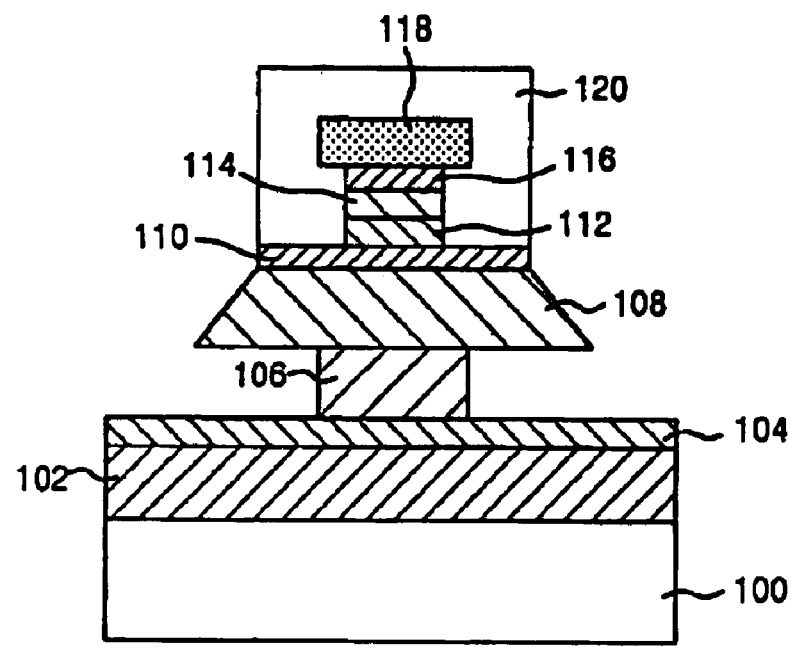

Next, the second sub-collector layer(106), which has an excellent selective side-etching characteristic, is being selectively side-etched as shown in FIG. 5, and then a void region is formed and the bottom surface of the collector InP layer(108), which can be hardly side-etched, is exposed thereby.

At this time, the side-etched rate of InGaAs Base(108) determining a base contact resistance decreases due to relatively thinner thickness than the second Sub-collector layer(106). As a result, InGaAs Base layer(110) is hardly influenced even during the process of forming a void and can prevent base contact resistance from increasing, the base contact occurring in method for reducing conventional base-collector parasitic capacitance.

Figure 6:
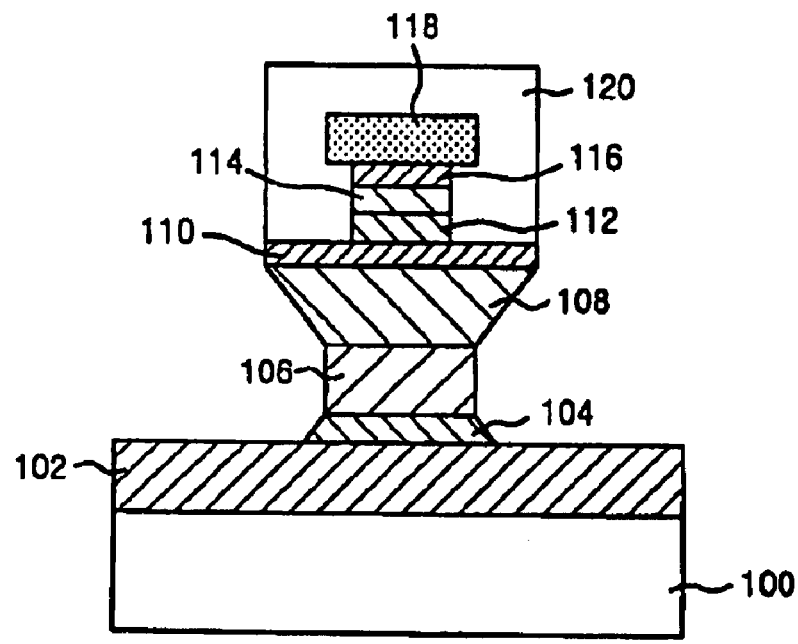

Then, the collector InP layer(108) is selectively etched by an anisotropic etching from the bottom with the second sub-collector InGaAs layer(106) being used as an etching mask as shown in FIG. 6. At this time, the InP layer(104), which was being used for an etch stop, is etched together to expose the first sub-collector InGaAs layer(102).

Consequently, parasitic capacitance is considerably reduced by the collector InP layer(108) etched by an anisotropic selective wet etching along with the grating direction. In addition, it is formed to have a structure at which a base- and a collector-metals can be deposited to be self-aligned, and thus it can reduce collector resistance.

Figure 7:
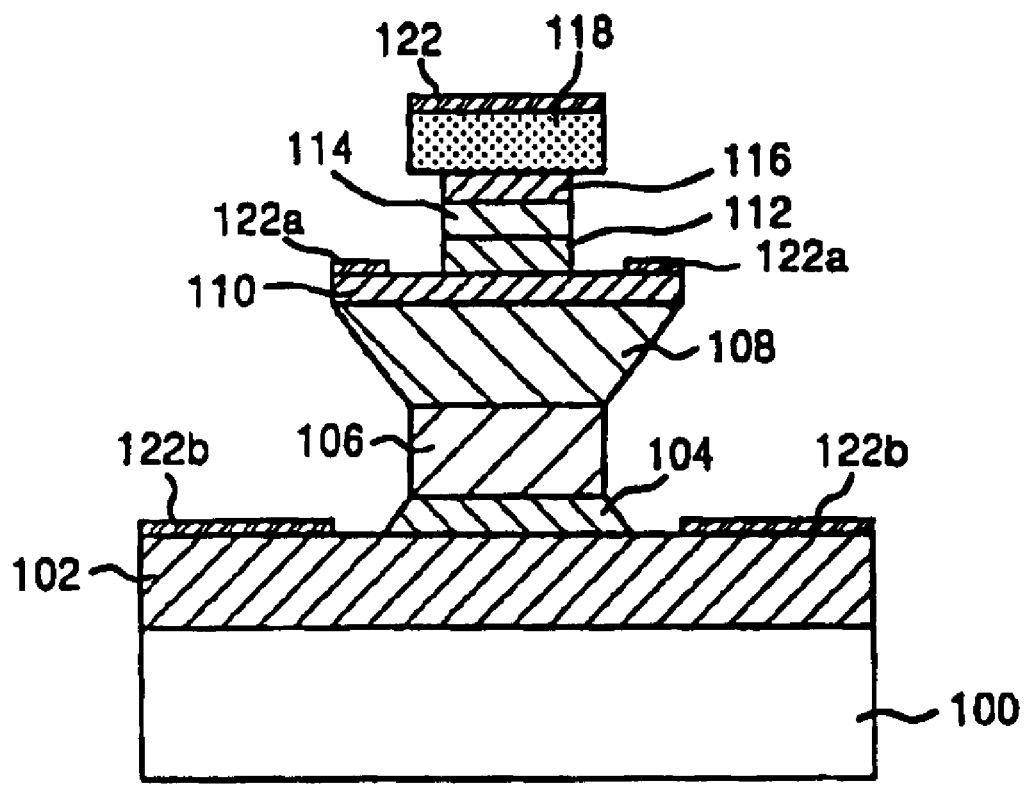

After eliminating the photo resistor(120) covering the emitter and depositing a metal layer(122) thereon by self-align method, a base metal layer(122a) and a collector metal layer(122b) are formed as described in FIG. 7. Emitter and base can be self-aligned by the conventional process as described above, and in addition, base and collector can be also self-aligned with reducing parasitic capacitance by the method presented in the present invention. Therefore, it is possible to construct a device structure that can afford an ultrafast operation.

As mentioned thereinbefore, the present invention provides a method of reducing device parasitic capacitance using underneath crystallographically selective wet etching that reduces parasitic capacitance effectively by maintaining base contact resistance uniformly and using an anisotropic selective etching crystallographically defined from underneath.

In addition, the present invention introduces a self-align method of base and collector metals to reduce the resistance, and thus it improves the device characteristic and simplifies the manufacturing process. In case of being used for an ultrafast power device, the present invention may considerably improve the high-frequency characteristic, which used to be not good enough in a prior power device.

Besides, the method of etching an upper layer from the bottom by using a void region formed by side-etching a layer having a good side-etching characteristic may have various applications other than just reducing parasitic capacitance.

Since those having ordinary knowledge and skill in the art of the present invention will recognize additional modifications and applications within the scope thereof, the present invention is not limited to the embodiment and drawings described above.

What is claimed is:

1. A manufacturing method of a device for reducing parasitic capacitance on the laminated structure of an InP/InGaAs double heterojunction bipolar transistor (DHBT) comprising:

a first process of alternately laminating a first and a second sub-collector InGaAs layers/a base InGaAs layer/an emitter InGaAs layer and an etch stop InP layer/a collector InP layer/a first and a second emitter InP layers on an InP substrate by an epitaxy method;

a second process of depositing an emitter metal layer thereon and thereafter etching said emitter InGaAs layer and said first and second emitter InP layers in sequence, for a base metal to be self-alignable, to expose the upper surface of said base InGaAs layer;

a third process of defining a photo resistor (PR) thereon for protecting the emitter region and thereafter etching said base InGaAs layer;

a fourth process of etching said collector InP layer with using said base InGaAs layer as a mask to expose the upper surface of said second sub-collector InGaAs layer;

a fifth process of selectively side-etching said second sub-collector InGaAs layer to expose the bottom surface of said collector InP layer where a void region is formed;

a sixth process of performing an anisotropic selective etching on the bottom surface of said collector InP layer, which contributes to parasitic capacitance, with using said second sub-collector InGaAs layer as a mask and on the surface of said etch stop InP layer simultaneously to expose the upper surface of said first sub-collector InGaAs layer; and a seventh process of eliminating said photo resistor (PR) and thereafter depositing a metal layer to form a base- and a collector-metal layers.

2. A manufacturing method of a device for reducing parasitic capacitance as claimed in claim 1, characterized in that an etching solution used for said third process is $H_2O_2:H_3PO_4:H_2O$.

3. A manufacturing method of a device for reducing parasitic capacitance as claimed in claim 1, characterized in that an etching process performed in said fourth process uses an anisotropic etching characteristic by which a layer is etched nonuniformly due to the etching speed difference along with the grating direction.

4. A manufacturing method of a device for reducing parasitic capacitance as claimed in claims 1 or 3, characterized in that the etching profile in said fourth process has an inclination angle ($\theta$) that is decided by the kind of an etching solution, and the concentration and the temperature of an etching solution.

5. A manufacturing method of a device for reducing parasitic capacitance as claimed in claim 1, characterized in that an etching process performed in said sixth process uses an anisotropic crystallographically-selective wet etching.

6. A manufacturing method of a device for reducing parasitic capacitance as claimed in claim 1, characterized in that said base- and collector-metal layers are deposited by self-align method in said seventh process.

* * * * *